United States Patent
Hata et al.

(10) Patent No.: US 8,812,062 B2
(45) Date of Patent: Aug. 19, 2014

(54) ELECTRONIC APPARATUS

(75) Inventors: Yoshikazu Hata, Kanagawa-ken (JP); Tomoko Honda, Kanagawa-ken (JP); Satoru Honda, Kanagawa-ken (JP); Nobuyoshi Kuroiwa, Kanagawa-ken (JP); Masaomi Nakahata, Kanagawa-ken (JP); Jun Morimoto, Kanagawa-ken (JP); Koichi Sato, Tokyo (JP); Akihiro Tsujimura, Tokyo (JP); Makoto Tabata, Tokyo (JP); Minoru Sakurai, Tokyo (JP); Shoji Kato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 728 days.

(21) Appl. No.: 11/902,450

(22) Filed: Sep. 21, 2007

(65) Prior Publication Data

US 2008/0182539 A1 Jul. 31, 2008

(30) Foreign Application Priority Data

Jan. 25, 2007 (JP) .................................. 2007-014724

(51) Int. Cl.
*H04M 1/00* (2006.01)

(52) U.S. Cl.
USPC ...... 455/575.1; 455/269; 455/348; 455/575.7

(58) Field of Classification Search
CPC .................................................... H01Q 1/243
USPC ............................ 455/269, 348, 575.1, 575.7
See application file for complete search history.

(56) References Cited

U.S. PATENT DOCUMENTS

| | | | |
|---|---|---|---|
| 7,265,719 B1 * | 9/2007 | Moosbrugger et al. ........ 343/700 MS |
| 2002/0183032 A1 * | 12/2002 | Fang ............................. 455/280 |
| 2003/0201945 A1 * | 10/2003 | Reece et al. .................. 343/795 |
| 2004/0056804 A1 * | 3/2004 | Kadambi et al. ........ 343/700 MS |
| 2005/0215296 A1 * | 9/2005 | Fujihara et al. ............. 455/575.3 |
| 2006/0082420 A1 * | 4/2006 | Kinoshita ...................... 333/1.1 |
| 2006/0270472 A1 * | 11/2006 | Chen et al. ................. 455/575.7 |

FOREIGN PATENT DOCUMENTS

JP 2002-111367 4/2002

OTHER PUBLICATIONS

Notification of the Second Office Action issued by the Chinese Patent Office on Jul. 2, 2012, for Chinese Patent Application No. 200810004600.X, and English-language translation thereof.

* cited by examiner

*Primary Examiner* — Hsin-Chun Liao
(74) *Attorney, Agent, or Firm* — Finnegan, Henderson, Farabow, Garrett & Dunner, L.L.P.

(57) ABSTRACT

An electronic apparatus includes: a first molded body; a second molded body which composes housing with the first molded body; a first conductive pattern provided in the housing; a second conductive pattern provided on an outer surface of the housing; and a first conductive member. The first conductive member passes through a gap of a mating face between the first molded body and the second molded body. The first conductive member connects the first conductive pattern and the second conductive pattern.

8 Claims, 8 Drawing Sheets

ELECTRONIC APPARATUS

CROSS-REFERENCE TO RELATED APPLICATIONS

This application is based upon and claims the benefit of priority from the prior Japanese Patent Application No. 2007-014724, filed on Jan. 25, 2007; the entire contents of which are incorporated herein by reference.

BACKGROUND OF THE INVENTION

1. Field of the Invention

This invention relates to an electronic apparatus.

2. Background Art

A folding-type or sliding-type electronic apparatus including cellular telephones and PDA (Personal Digital Assistant), the housing is occasionally composed of an upper housing and a lower housing. In this case, for example, the upper housing is a display portion and the lower housing is an operating portion including a keyboard part. This is the same in an integrated-type electronic apparatus.

Each of the housings contains two molded bodies, and a liquid crystal display device, a key board part, a substrate on which electronic components are disposed, a secondary battery, and so forth are housed.

When a conductive pattern such as an antenna pattern provided on an outer surface of a molded body is connected inside the housing, a structure of fixing a metal terminal with a screw or the like is widely used. This structure is simple but the connection easily becomes unstable by vibration or mechanical shock, and an area to which the metal terminal is attached is required, and therefore, this structure is disadvantageous for downsizing and thinning of the electronic apparatus.

There is a disclosed example of a technique with respect to an antenna device enabling surface mounting that the power is supplied to a radiation electrode of a patch antenna through a through-hole conductor and a pattern conductor that is provided on the same main surface as and a ground electrode (Japanese Unexamined Patent Publication JP-A 2002-111367 (Kokai)).

SUMMARY OF THE INVENTION

According to an aspect of the invention, there is provided an electronic apparatus including: a first molded body made of an insulator; a second molded body made of an insulator and closed together with the first molded body; a substrate provided with a first conductive pattern and fixed to the first molded body or the second molded body; and a conductive member connecting the first conductive pattern and a second conductive pattern provided on an outer surface of at least one of the first and second molded bodies, the conductive member being provided so as to pass through a gap of a mating face between the first molded body and the second molded body.

According to another aspect of the invention, there is provided an electronic apparatus including: a first molded body made of an insulator; a second molded body made of an insulator and closed together with the first molded body; a substrate fixed to the first molded body or the second molded body; and a conductive member connecting, in at least any one of the first and second molded bodies, a first conductive pattern provided on an inner surface thereof and a second conductive pattern, the second conductive pattern being provided on an outer surface thereof, the conductive member being provided so as to pass through a gap of a mating face between the first molded body and the second molded body, and the first conductive pattern being connected to an electric circuit provided on the substrate.

According to another aspect of the invention, there is provided an electronic apparatus including: a first molded body; a second molded body, the second molded body composing housing with the first molded body; a first conductive pattern provided in the housing; a second conductive pattern provided on an outer surface of the housing; and a first conductive member passing through a gap of a mating face between the first molded body and the second molded body, and connecting the first conductive pattern and the second conductive pattern.

DETAILED DESCRIPTION OF THE INVENTION

Hereinafter, embodiments of this invention will be explained with reference to drawings.

Figure 1A:
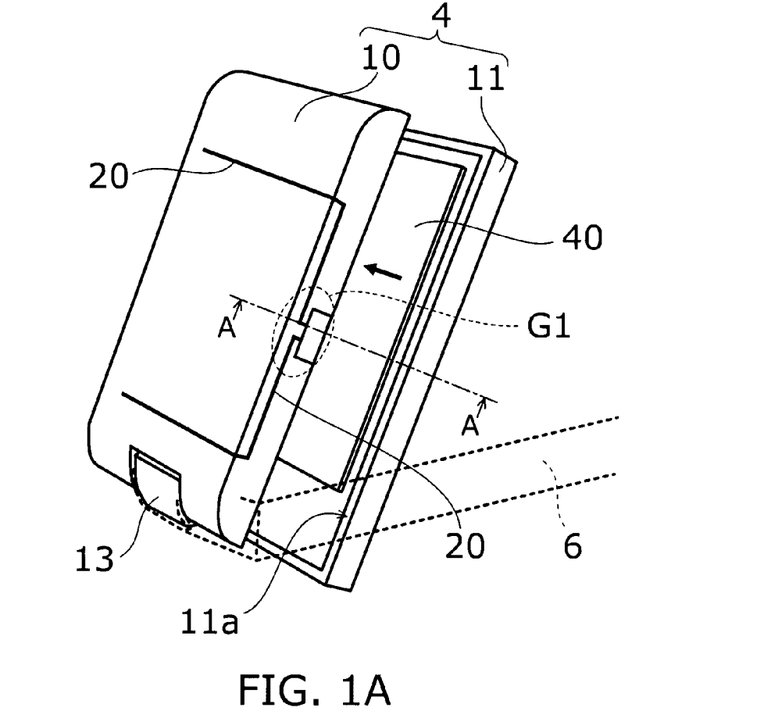
FIGS. 1A and 1B show an electronic apparatus according to the first embodiment of this invention
Figure 1B:
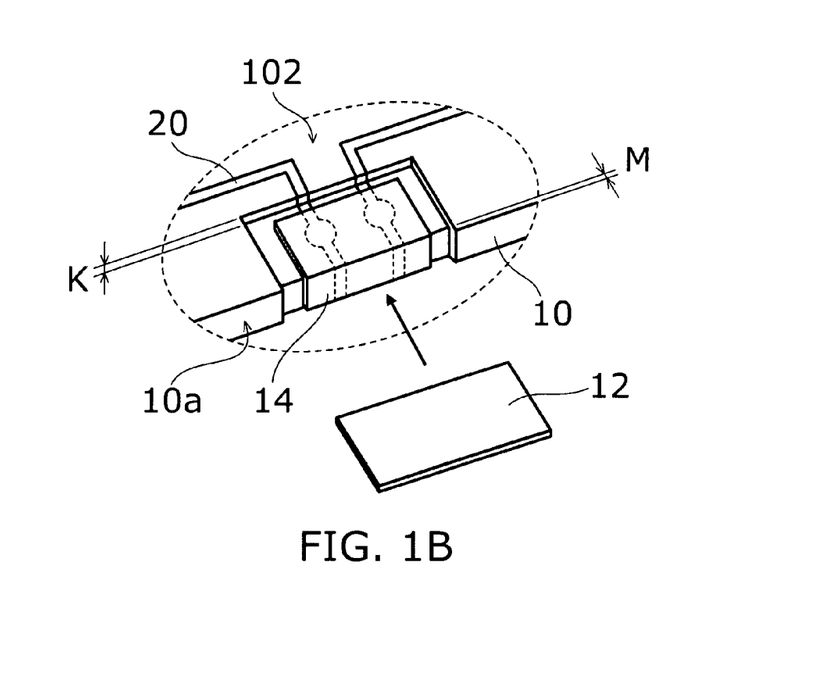

FIGS. 1A and 1B show an electronic apparatus according to the first embodiment of this invention, and FIG. 1A is a schematic perspective view of an upper housing, and FIG. 1B is a partial magnified view of the dash line G1. In FIG. 1B, on an outer surface of a first molding body 10 made of a resin or the like, an antenna pattern 20 is provided by pad printing or the like.

Moreover, inside a second molded body 11 made of a resin or the like, for example, a substrate 40 is fixed, and a first molded body 10 is closed together therewith and fixed thereto, and thereby, the upper housing 4 is composed. When the upper housing 4 is a display portion, a liquid crystal display device (not shown) and so forth are further disposed. FIGS. 1A and 1B show, for example, a folding-type cellular telephone, and the upper housing 4 and the lower housing 6 are connected with a hinge part 13 or the like.

As shown in FIG. 1B, an end of an antenna pattern 20 provided on an outer surface 102 before coating is connected to the inside of the upper housing 4 with a conductive member 14. Into a concave portion of the first molded body 10 provided for attaching the conductive member 14 thereinto, a veneer 12 is fit to make its surface flat and thereby the appearance is improved.

Figure 2A:
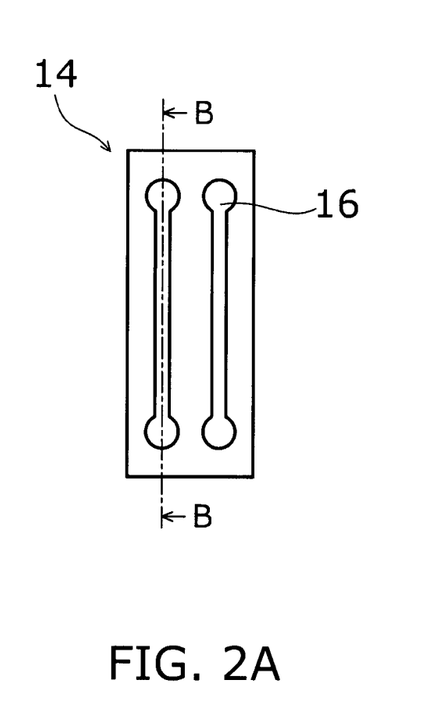
FIGS. 2A and 2B show the conductive member 14.
Figure 2B:
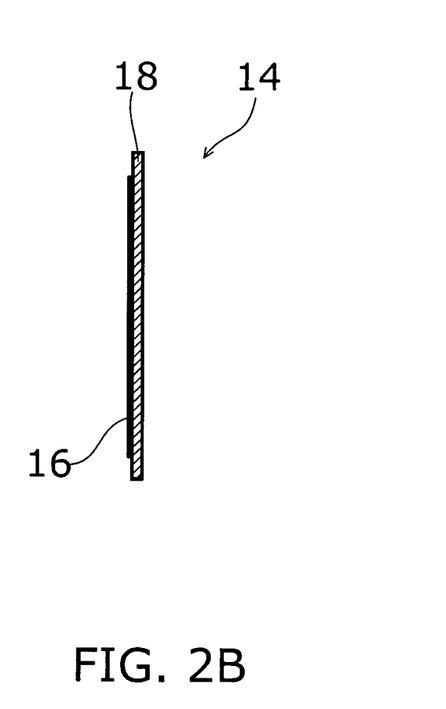

FIGS. 2A and 2B show the conductive member 14. FIG. 2A is a schematic plan view, and FIG. 2B is a schematic section view along the chain line B-B. The conductive member 14 contains a conductive layer 16 formed on a thin film 18 made of an organic insulating material such as PET (Polyethylene Terephthalate) or PI (Polyimide) by a method of, pad printing or screen printing with a silver or copper paste, drawing by inkjet with a conductive material, vapor-deposition or sputtering with a metal, or the like.

Onto the conductive member 14 contacting a surface of the first molded body 10 except for a conductive pattern region such as the antenna pattern 20, an adhesive material having tackiness property is applied for enabling positioning and fixation. Moreover, for the connection surface, a conductive paste having an adhesive force, ACP (Anisotropic Conductive Paste), ACF (Anisotropic Conductive Film), or the like is used to ensure the conduction.

In the case of using ACP, when ACP is also applied to the conductive pattern including the antenna pattern 20, the adhesive material is not required.

Figure 3A:
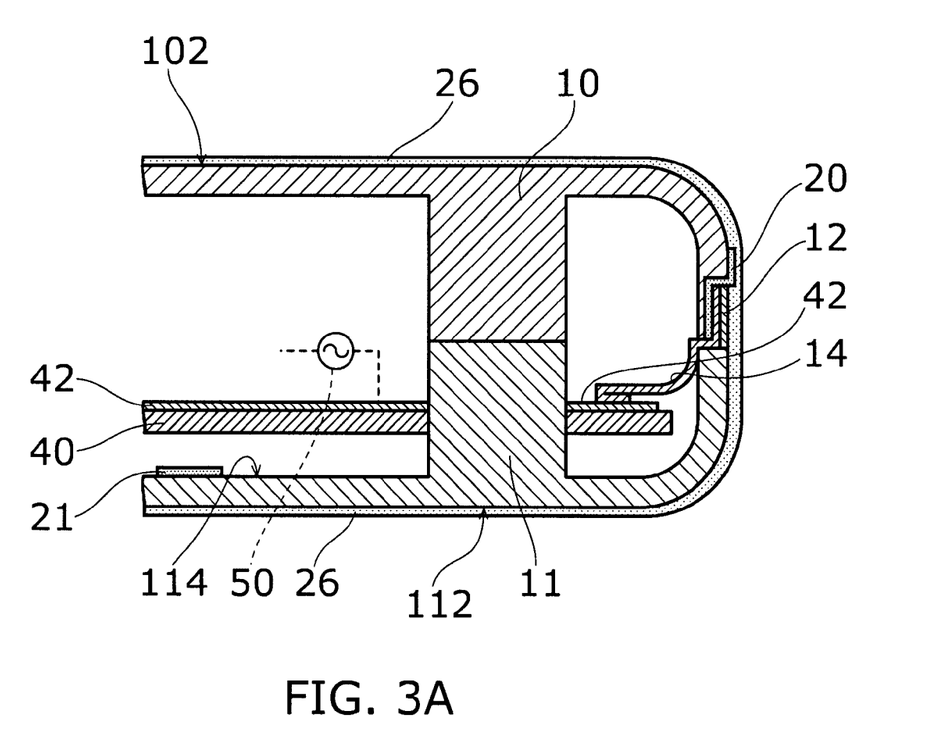
FIGS. 3A and 3B show a connection structure of a conductive pattern of the antenna pattern 20 and a conductive pattern on the substrate 40.
Figure 3B:
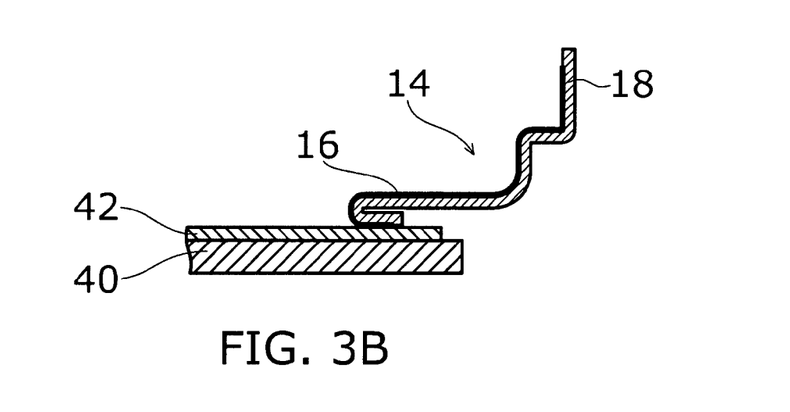

FIGS. 3A and 3B show a connection structure of a conductive pattern of the antenna pattern 20 and a conductive pattern on the substrate 40. FIG. 3A is a schematic section view along the A-A line of FIG. 1A, and the FIG. 3B is a magnified view of the conductive member 14. The antenna pattern 20 provided on the outer surface 102 of the first molded body 10 before coating is connected to a conductive pattern 42 on the substrate 40 fixed to the second molded body 11, through the conductive member 14.

When a conductive layer 16 is provided on one surface as shown in FIGS. 2A and 2B as the conductive member 14, an end of the conductive pattern 42 connected to a power supply part 50 as shown in FIG. 3B is connected to one end of the conductive layer 16 composing the conductive member 14, and the other end of the conductive layer 16 is connected to the antenna pattern 20. That is, the conductive member 14 is disposed so as to pass through a gap of a mating face between the first molded body 10 and the second molded body 11.

In this case, a cutout portion may be provided in a side portion of the first molded body 10 or the second molded body 11. FIG. 1B is the case in which a cutout portion of the gap M is provided on the first molded body 10. The first molded body 10 and the second molded body 11 have the mating face 10a (parting face) and the mating face 11a (parting face), respectively. In the cutout portion, the gap M is more than the thickness of the conductive member 14. The shape of an end of the antenna pattern 20 is a circle or a rectangle that is wider than the antenna pattern 20 so that mechanical and electrical connection with the conductive layer 16 in the conductive member 14 becomes easy.

The other end of the antenna pattern extends on to the concave portion having a step K from the outer surface 102 of the first molded body 10. In this case, the step K is the total sum of the thickness of the conductive member and the thickness of the veneer 12 or more. By providing the concave portion, the step of the outer surface 102 of the first molded body 10 except for the antenna pattern 20 region can be made to disappear.

Furthermore, coating is performed for adjusting the design aspect as an electronic apparatus. The thickness of the antenna pattern 20 is some—some tens of micrometers. Therefore, it is preferable that the step is reduced by thickening the coating of the part except for the antenna pattern 20 region and the appearance is improved.

Figure 4:
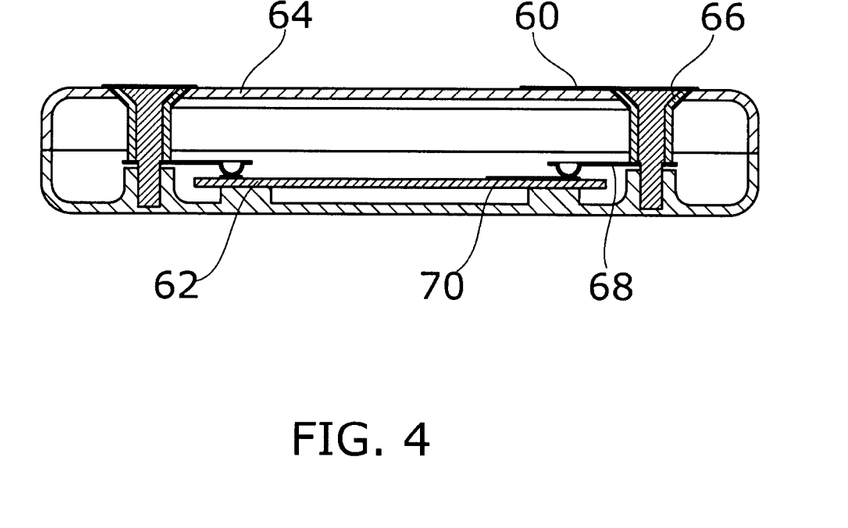
FIG. 4 is a schematic section view showing the connection between an antenna pattern 60 and a substrate 62 in an electronic apparatus according to Comparative Example.

FIG. 4 is a schematic section view showing the connection between an antenna pattern 60 and a substrate 62 in an electronic apparatus according to Comparative Example. In this case, the antenna pattern 60 provided on an outer surface of the first molded body 64 is electrically connected to a metal terminal 68 having rich elasticity through a metal sleeve 66. A conductive pattern 70 on the substrate 62 and the metal terminal 68 are pressed by elasticity and contacted.

At the contact point portion, the connection occasionally becomes unstable by vibration or shock. Moreover, by corrosion due to a gas or oxidation near the contact point, reliability of the connection occasionally becomes insufficient. Furthermore, a space for attaching the metal sleeve 66 and the metal terminal 68 thereto is required, and downsizing and thinning of the electronic apparatus is made to be difficult. By contrast, in the first embodiment, the electronic apparatus being capable of downsizing and thinning with maintaining stable electrical connection is provided.

Here, explanation of the antenna pattern will be complemented.

Figure 5A:
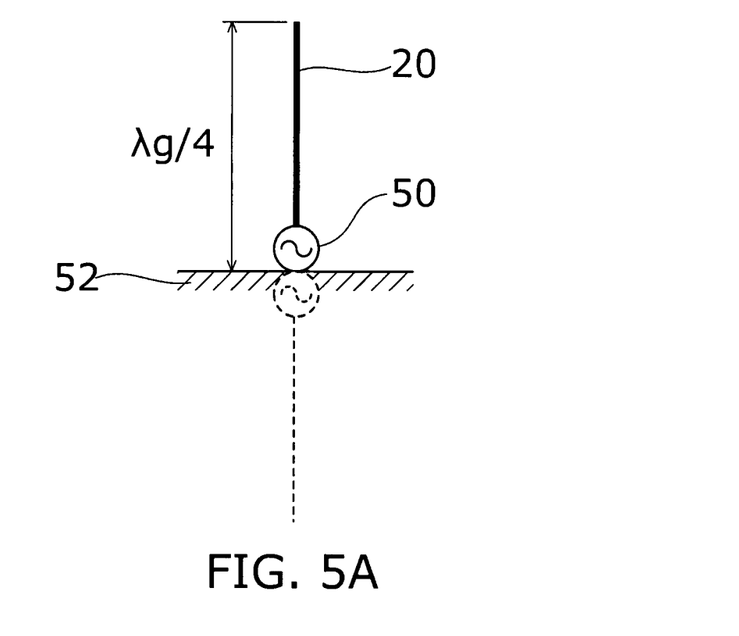
FIGS. 5A and 5B are schematic views showing structures of the antenna.
Figure 5B:
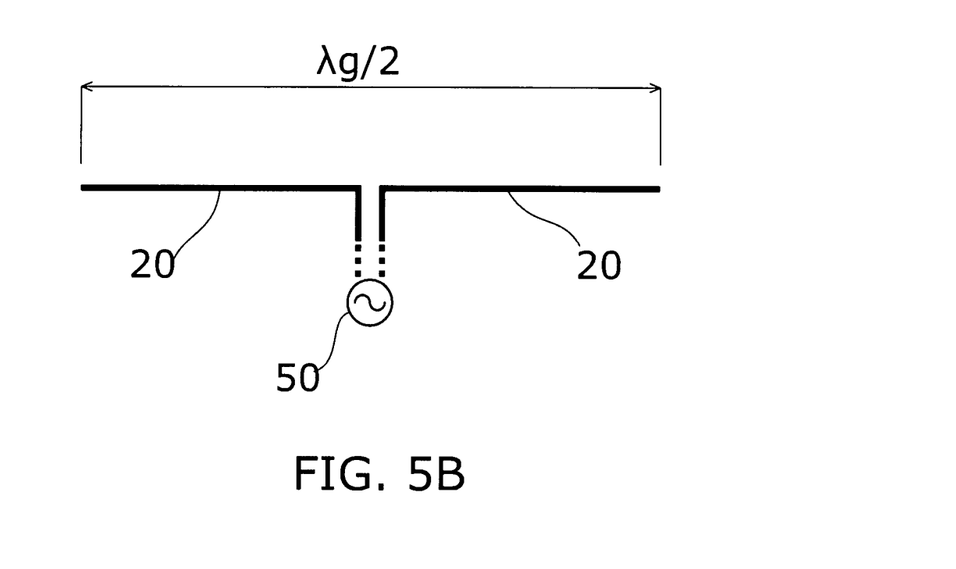

FIGS. 5A and 5B are schematic views showing structures of the antenna. FIGS. 5A and 5B show a monopole antenna and a dipole antenna, respectively. The length of the antenna pattern 20 of a monopole antenna is an approximately quarter wavelength. The power supply part 50 is connected to one end of the monopole antenna and to a ground 52 and excites the antenna. The ground 52 is, for example, provided on a back surface of the substrate 40 of FIG. 1A and acts as a half-wavelength antenna by an image represented by dash line in FIG. 5A. Because permittivity of a material composing the first molded body 10 is more than 1, the wavelength is shorter than that of free space and the antenna pattern 12 can be downsized.

FIG. 5B shows a dipole antenna. The length of the antenna is an approximately half wavelength. Each of the two of the antenna divided at the midpoint of the antenna pattern 20 is connected to the power supply part 50 and the antenna is excited. The power supply part 50 is provided on the substrate 40 as shown in FIGS. 1A and 3 and connected to the antenna pattern 20 with a conductive pattern. Also, as the antenna, an inverted-F antenna can be used.

In the FIGS. 1A and 1B, when the antenna pattern 20 is the dipole antenna, the two ends of the antenna patterns 20 of the dash line parts are connected to the respective terminals of the power supply part 50. Moreover, when the monopole antenna, the apparatus comes to have two antenna patterns and the respective ends thereof are connected to the power supply parts 50.

Figure 6A:
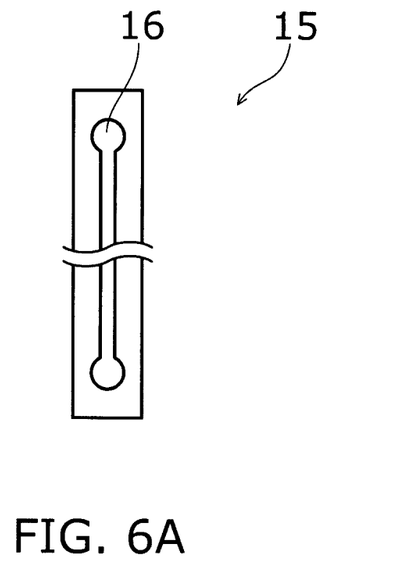
FIGS. 6A and 6B are schematic views showing the first modified example of the conductive member.
Figure 6B:
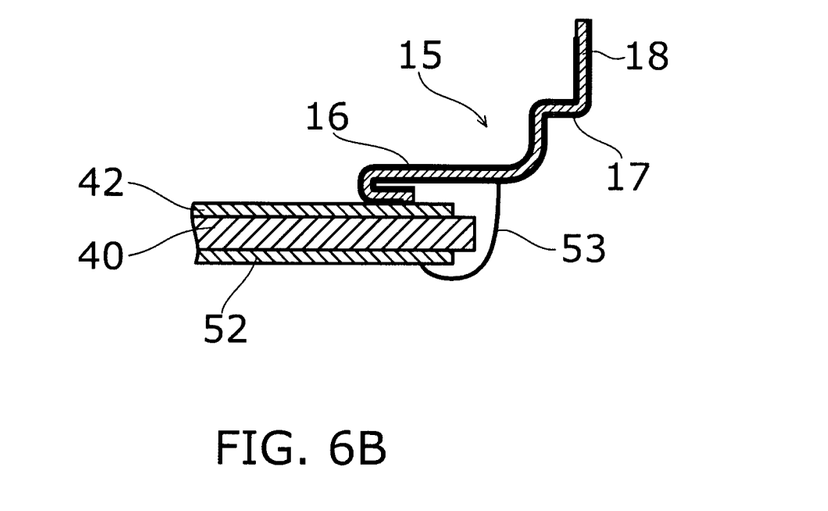

FIGS. 6A and 6B are schematic views showing the first modified example of the conductive member. FIG. 6A is a schematic plan view, and the FIG. 6B is a schematic section view. In a conductive member 15, the conductive layer 16 is selectively provided on one surface of the film 18 made of an insulator, and the conductive layer 17 is provided on the other surface. The conductive layer 17 is connected to a ground 52 on the back surface of the substrate 40 through a connection line 53 and acts as a microstrip line. In this case, with respect to the conductive layer 17 to be the ground, radio waves can be concentrated on the side of the conductive layer 16.

Figure 7A:
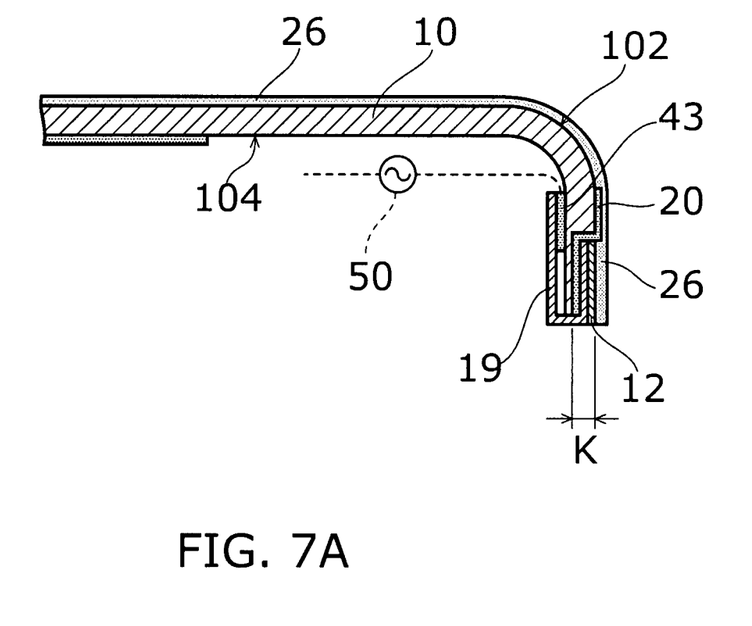
FIGS. 7A and 7B are schematic views showing the second modified example of the conductive member.
Figure 7B:
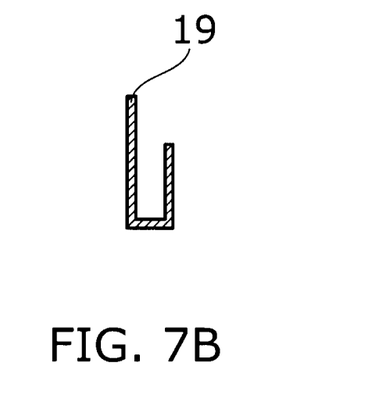

FIGS. 7A and 7B are schematic views showing the second modified example of the conductive member. A conductive member 19 is composed of a metal thin plate. The conductive member 19 is folded as shown in FIG. 7B, and mechanically or electrically connected to a conductive pattern 43 provided on an inner surface 104 of the first molded body 10, by adhesion or the like. Moreover, the conductive member 19 is connected to an end of the antenna pattern 20 provided on the outer surface 102, by adhesion or the like. The veneer 12 is fit into the step K connected to the antenna pattern 20, and a coating film 26 is provided on the entire surface. The conductive pattern 43 provided on the inner surface 104 of the first molded body 10 is connected to the power supply part 50 and the antenna is excited.

Figure 8:
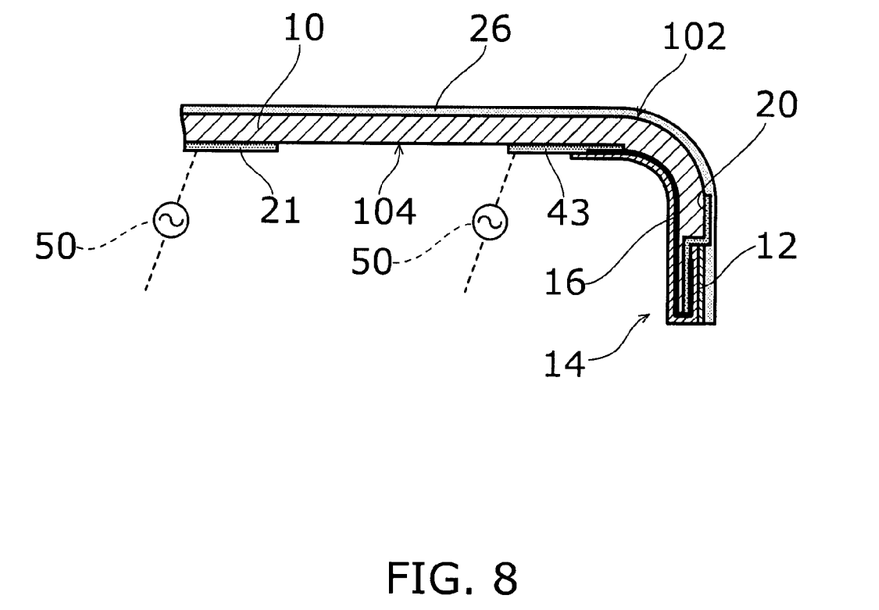
FIG. 8 is a schematic section view showing the electronic apparatus according to the second embodiment of this invention.

FIG. 8 is a schematic section view showing the electronic apparatus according to the second embodiment of this invention. In this embodiment, one end of the conductive layer 16 provided in the conductive member 14 using the film shown in FIGS. 2A and 2B is connected to the antenna pattern 20 of the outer surface 102, and the other end is connected to the conductive pattern 43 provided on the inner surface 104.

When another antenna pattern 21 is provided on the inner surface 104 of the first molded body 10, a multiband becomes possible. The another antenna pattern 21 can also be provided on an inner surface of the second molded body 11 as shown in FIGS. 3A and 3B. The antenna patterns provided on the inner surfaces 104 and 114 in the first molded body 10 and in the second molded body 11 are connected to the conductive pattern 42 on the substrate 40, by using a metal wire, a metal thin plate, a flexible substrate or the like.

Furthermore, the another antenna pattern can be provided on an outer surface 112 of the second molded body 11 as shown in FIGS. 3A and 3B. In this case, it is preferable that a conductive member 14 is attached to a mating face that does not overlap with the first molded body 10. By providing a plurality of the conductive members 14 as described above, it becomes easy to provide a plurality of antenna patterns corresponding to a multiband system. That is, one of the antenna patters can be used for a first frequency band, and other of the antenna patterns can be used for a second frequency band which is different from the first frequency band.

As a result, the sending and receiving function can be extended including wireless LAN, FM and AM broadcast, GPS (Global Positioning System), and one-segment broadcast of receiving terrestrial digital broadcasting, as well as cellular-phone triple band such as GSM (Global System for Mobile Communication), and DCS (Digital Cellular System)/PCS (Personal Communications Service). Furthermore, an electronic apparatus being capable of downsizing and thinning with maintaining stable electrical connection is provided.

In the above-described embodiments, the case in which the conductive pattern is an antenna pattern has been explained, but this invention is not limited thereto. The conductive pattern for wiring with circuit components including a semiconductor element is also included in this invention.

In the above-described embodiment examples and the modified examples associated therewith, the folding-type electronic apparatus including the upper housing 4 and the lower housing 6 has been explained. However, this invention is not limited thereto. A sliding-type electronic apparatus is also possible. In this case, in the outer surface 102 of the first molded body 10 of the upper housing 4, a display screen is disposed, and the outer surface 112 of the second molded body 11 comes to face to the inner surface 114 of the lower housing 6. In such an open state of a sliding-type electronic apparatus, the antenna pattern 20 is occasionally provided on the outer surface 112 of the second molded body 11 composing the upper housing 4. Moreover, without superposing the two housings, the case of one housing is possible.

As described above, the embodiments of this invention have been explained with reference to drawings. However, this invention is not limited to these embodiments. Various design changes by those skilled in the art with respect to the housing, the conductive member, the conductive pattern, the substrate, the power supply part, the antenna pattern, and so forth, which compose the electronic apparatus, are also included in this invention as long as not departing from the purport of this invention.

The invention claimed is:
1. An electronic apparatus comprising:
a first molded body made of an insulator;
a second molded body made of an insulator operable to compose a housing with the first molded body, a prescribed region of the housing having a gap between the first and second bodies;
a substrate having an electric circuit fixed to the first molded body or the second molded body in the housing;
a first conductive pattern provided in the housing;
a second conductive pattern provided on an outer surface of the housing so as to extend toward the prescribed region;
a third conductive pattern provided in the housing;
a first conductive member provided in the housing; and
a second conductive member disposed through a gap, one end of the second conductive member being connected to the first conductive pattern in the housing, the other end of the second conductive member being connected to the second conductive pattern,
wherein
at least one of the first and second conductive patterns is a first antenna pattern for a first frequency band,
the third conductive pattern is a second antenna pattern for a second frequency band, the second frequency band being different from the first frequency band,
the first conductive pattern is connected to the electric circuit in the substrate through the first conductive member, and
the first and second conductive members are flexible.
2. The electronic apparatus according to claim 1, further comprising:
a fourth conductive pattern provided on the outer surface of the housing so as to extend toward the prescribed region;
a third conductive member provided in the housing; and
a fourth conductive member disposed through the gap, one end of the fourth conductive member being connected to the third conductive pattern in the housing, the other end of the fourth conductive member being connected to the fourth conductive pattern, wherein
the third conductive pattern is connected to the electric circuit in the substrate through the third conductive member, and
the third and fourth conductive members are flexible.
3. The electronic apparatus according to claim 2, wherein the fourth conductive member has a second insulating film, a first conductive layer provided on one surface of the second insulating film and a second conductive layer provided on other surface of the second insulating film,
the third conductive layer connects the third conductive pattern and the fourth conductive pattern, and
the fourth conductive layer is connected to a ground.
4. The electronic apparatus according to claim 1, wherein at least one of the first and second molded bodies have a cutout portion, the cutout portion being provided at a mating face between the first and second molded bodies, and the second conductive member passes through the cutout portion.
5. The electronic apparatus according to claim 1, wherein the second conductive member has a first insulating film, a first conductive layer provided on one surface of the first insulating film and a second conductive layer provided on other surface of the first insulating film,
the first conductive layer connects the first conductive pattern and the second conductive pattern, and
the second conductive layer is connected to a ground.
6. The electronic apparatus according to claim 1, wherein one of the first conductive member and the second conductive member has an insulating film and a conductive layer or a metal thin plate provided on the insulating film.
7. The electronic apparatus according to claim 1, wherein the second conductive pattern extends onto a concave portion formed on an outer surface of the first molded body or the second molded body, one end of the first conductive member is bonded to the second conductive pattern, and a veneer is fit into the concave portion.

8. The electronic apparatus according to claim 7, wherein outer surfaces of the first molded body, the second molded body, and the veneer are covered with a coating film.

* * * * *